US010510794B2

(12) United States Patent
Wu et al.

(10) Patent No.: US 10,510,794 B2
(45) Date of Patent: Dec. 17, 2019

(54) SEMICONDUCTOR IMAGE SENSOR

(71) Applicant: TAIWAN SEMICONDUCTOR MANUFACTURING COMPANY LTD., Hsinchu (TW)

(72) Inventors: Wen-Hau Wu, New Taipei (TW); Keng-Yu Chou, Kaohsiung (TW); Chun-Hao Chuang, Hsinchu (TW); Wei-Chieh Chiang, Changhua County (TW); Chien-Hsien Tseng, Hsinchu (TW); Kazuaki Hashimoto, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/843,536

(22) Filed: Dec. 15, 2017

(65) Prior Publication Data

US 2019/0131329 A1 May 2, 2019

Related U.S. Application Data

(60) Provisional application No. 62/579,461, filed on Oct. 31, 2017.

(51) Int. Cl.
*H01L 27/146* (2006.01)

(52) U.S. Cl.
CPC ...... *H01L 27/1464* (2013.01); *H01L 27/1462* (2013.01); *H01L 27/1463* (2013.01); *H01L 27/14607* (2013.01); *H01L 27/14636* (2013.01); *H01L 27/14621* (2013.01); *H01L 27/14627* (2013.01); *H01L 27/14645* (2013.01)

(58) Field of Classification Search
CPC ......... H01L 27/14627; H01L 27/14629; H01L 27/1463; H01L 27/14636; H01L 27/1464
See application file for complete search history.

(56) References Cited

U.S. PATENT DOCUMENTS

| 9,431,452 | B1 * | 8/2016 | Liu ................... H01L 27/1463 |
| 9,443,899 | B1 | 9/2016 | Liu et al. |
| 9,761,623 | B2 | 9/2017 | Liu et al. |

(Continued)

FOREIGN PATENT DOCUMENTS

| TW | 201729405 | 8/2017 |
| TW | I597832 | 9/2017 |

OTHER PUBLICATIONS

Office Action and Search Report dated Oct. 5, 2018 issued by the Taiwan Intellectual Property Office (TIPO) for counterpart application No. 107110799.

(Continued)

*Primary Examiner* — Cuong Q Nguyen
(74) *Attorney, Agent, or Firm* — WPAT, P.C., Intellectual Property Attorneys; Anthony King

(57) ABSTRACT

A BSI image sensor includes a substrate including a front side and a back side opposite to the front side, a pixel sensor disposed in the substrate, an isolation structure surrounding the pixel sensor and disposed in the substrate, a dielectric layer disposed over the pixel sensor on the front side of the substrate, and a plurality of conductive structures disposed in the dielectric layer and arranged to aligned with the isolation structure.

20 Claims, 10 Drawing Sheets

(56) References Cited

U.S. PATENT DOCUMENTS

| | | | | |
|---|---|---|---|---|
| 2010/0176474 A1* | 7/2010 | Kwon | ................. | H01L 27/1464 |
| | | | | 257/432 |
| 2012/0313204 A1* | 12/2012 | Haddad | .............. | H01L 27/1464 |
| | | | | 257/432 |
| 2016/0211290 A1* | 7/2016 | Tsai | .................... | H01L 27/1464 |
| 2017/0236858 A1* | 8/2017 | Oh | ...................... | H01L 27/1463 |
| | | | | 257/292 |
| 2019/0088695 A1* | 3/2019 | Chhun | ............... | H01L 27/1464 |

OTHER PUBLICATIONS

Foreign Document No. I597832 is the counterpart to U.S. Pat. No. 9,443,899.

Foreign Document No. TW 201729405 is the counterpart to U.S. Pat. No. 9,761,623.

\* cited by examiner

SEMICONDUCTOR IMAGE SENSOR

PRIORITY DATA

This patent claims the benefit of U.S. Provisional Patent Application Ser. No. 62/579,461 filed Oct. 31, 2017, the entire disclosure of which is hereby incorporated by reference.

BACKGROUND

Digital cameras and other imaging devices employ images sensors. Image sensors convert optical images to digital data that may be represented as digital images. An image sensor includes an array of pixel sensors and supporting logic circuits. The pixel sensors of the array are unit devices for measuring incident light, and the supporting logic circuits facilitate readout of the measurements. One type of image sensor commonly used in optical imaging devices is a back side illumination (BSI) image sensor. BSI image sensor fabrication can be integrated into conventional semiconductor processes for low cost, small size, and high integration. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
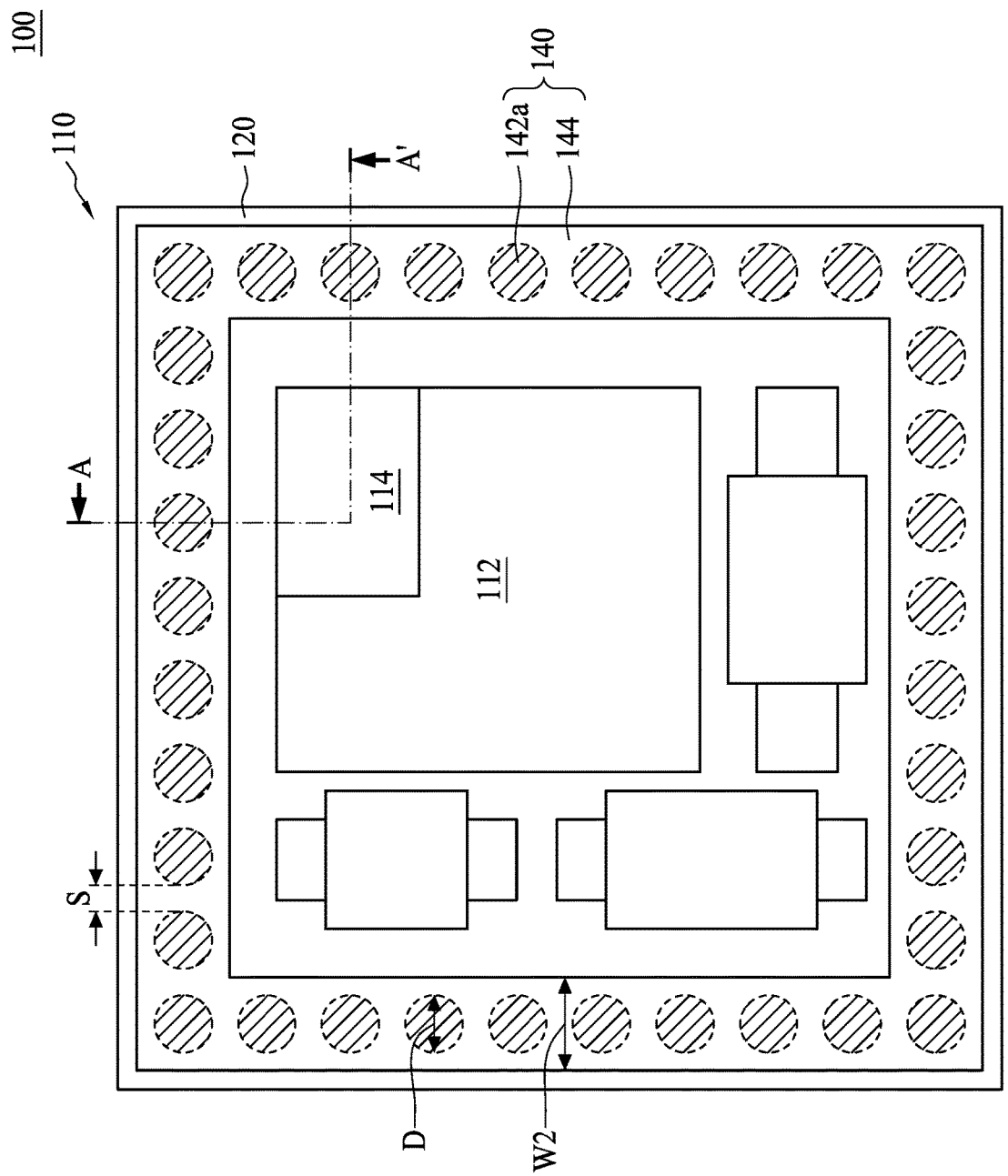
FIG. 1 is a plan view of a pixel sensor of a BSI image sensor according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

BSI image sensor includes an array of pixel sensors. Typically, BSI image sensors include an integrated circuit having a semiconductor substrate and light-sensing devices such as photodiodes corresponding to the pixel sensors arranged within the substrate, a back-end-of-line (BEOL) metallization of the integrated circuits disposed over a front side of the substrate, and an optical stack including color filters and micro-lens corresponding to the pixel sensors disposed over a back side of the substrate. As the size of BSI image sensors decrease, BSI image sensors face a number of challenges. One challenge with BSI image sensors is cross talk between neighboring pixel sensors As BSI image sensors become smaller and smaller, distance between neighboring pixel sensors becomes smaller and smaller, thereby increasing the likelihood of cross talk. Another challenge with BSI image sensors is light collection. Also as image sensors become smaller and smaller, the surface area for light collection becomes smaller and smaller, thereby reducing the sensitivity of pixel sensors. This is problematic for low light environments. Therefore, it is in need to reduce cross talk and to increase absorption efficiency of the pixel sensors such that performance and sensitivity of BSI image sensors is improved.

The present disclosure therefore provides a BSI image sensor including a reflective grid surrounding and separating the pixel sensors. Thus, light is directed and reflected to the pixel sensor instead of entering to the neighboring pixel sensors. In other words, cross talk is reduced and light is trapped in the pixel sensors, thus performance and sensitivity of the pixel sensors are both improved.

Figure 2:
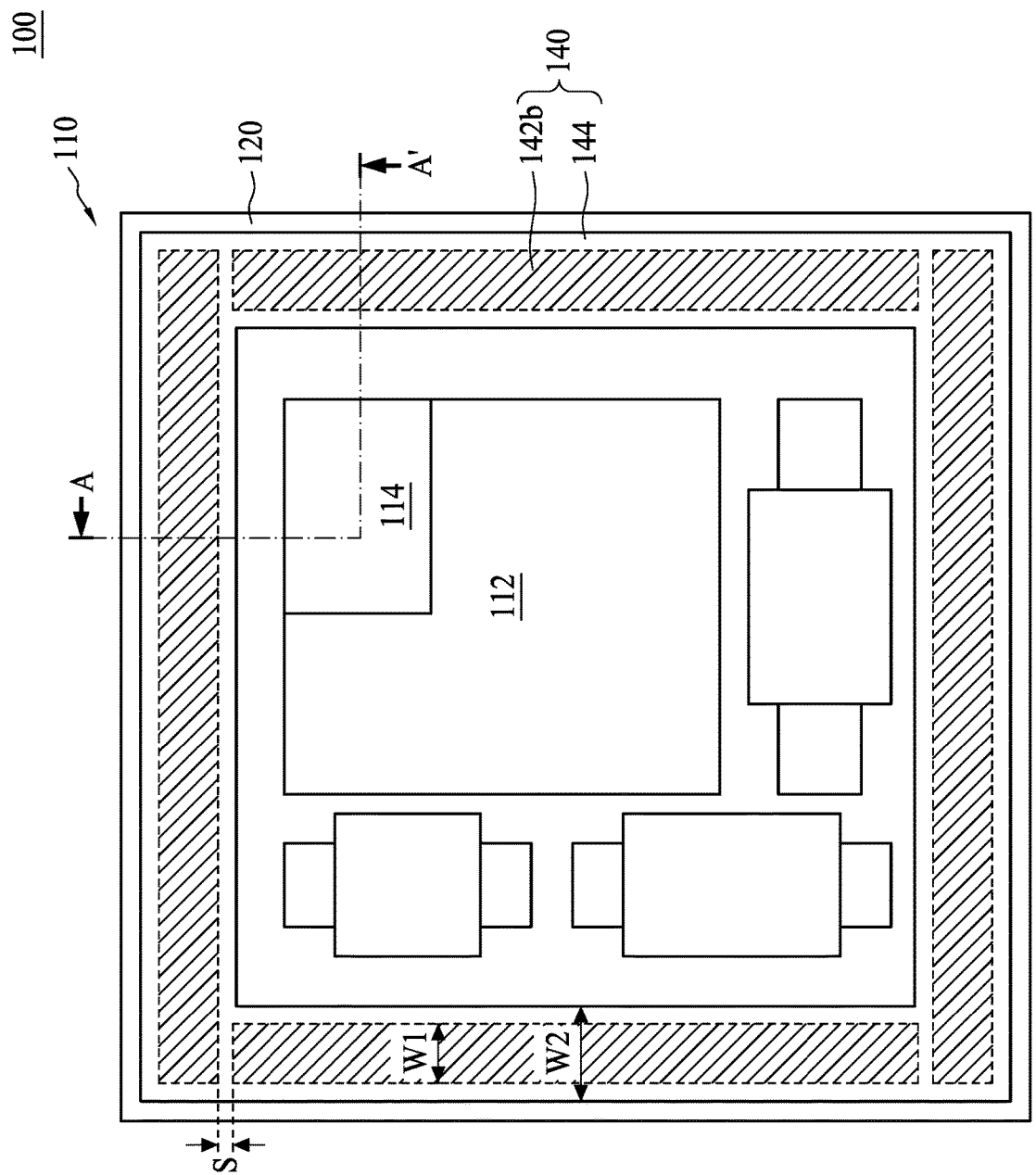
FIG. 2 is a plan view of a pixel sensor of a BSI image sensor according to aspects of the present disclosure in one or more embodiments.
Figure 3:
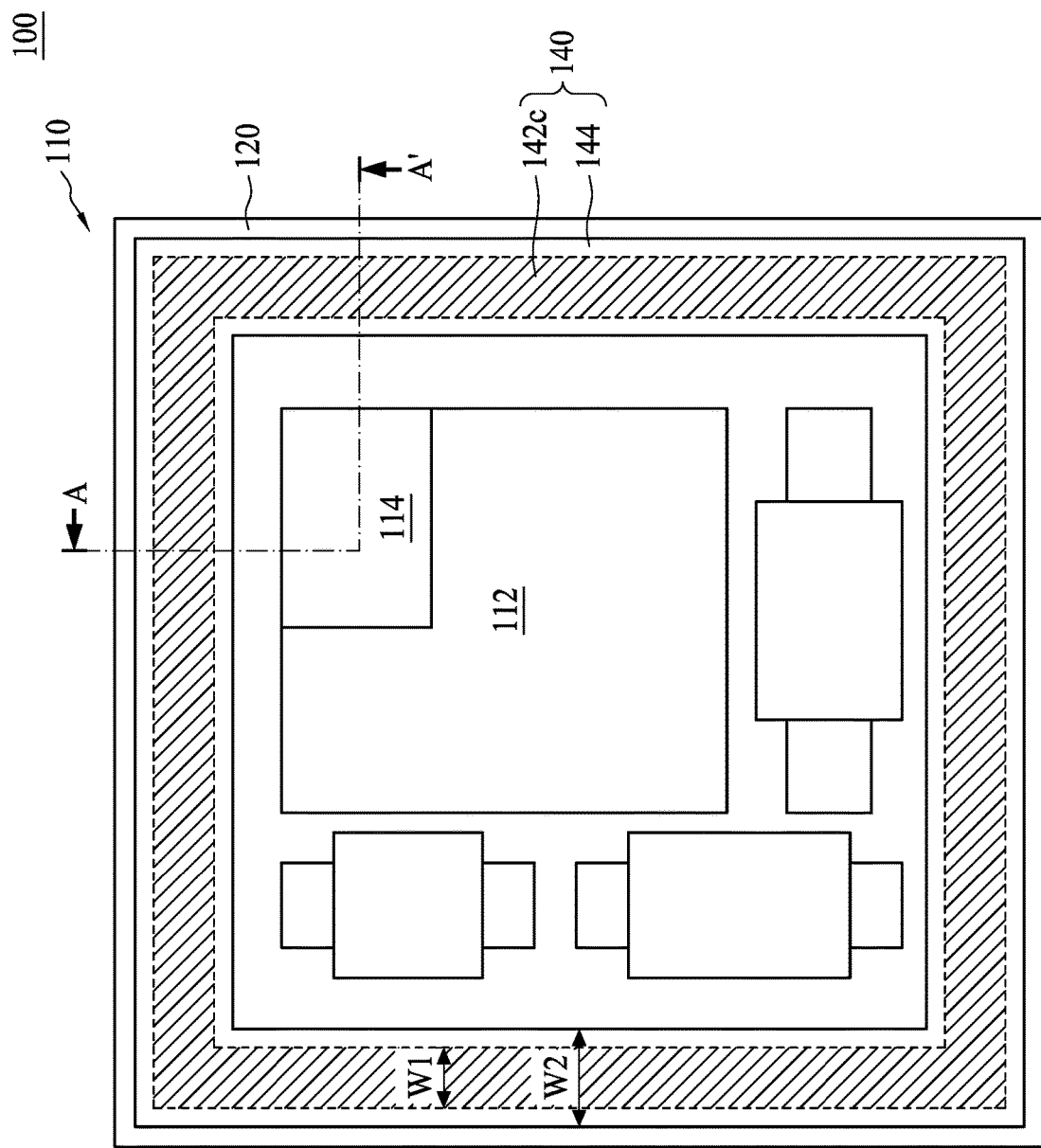
FIG. 3 is a plan view of a pixel sensor of a BSI image sensor according to aspects of the present disclosure in one or more embodiments.
Figure 4:
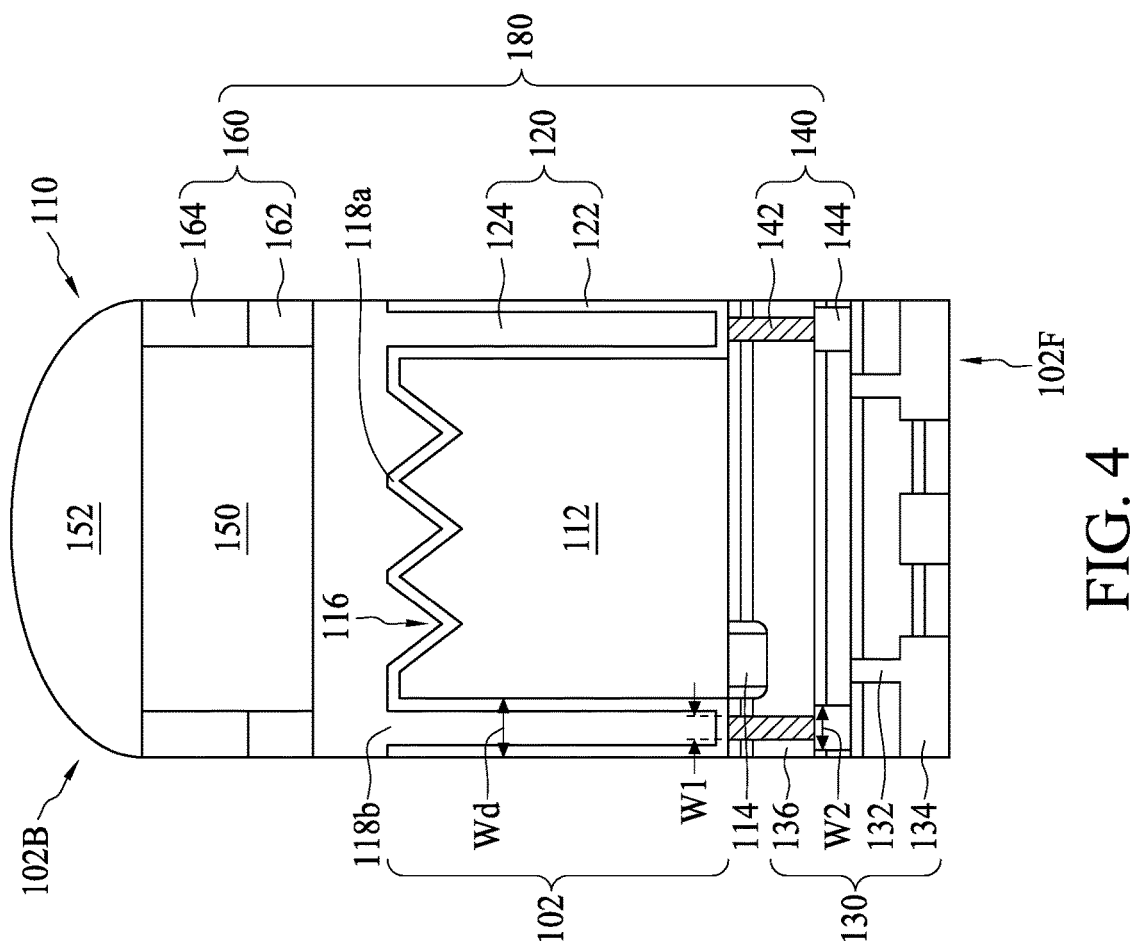
FIG. 4 is a cross-sectional view of the pixel sensor of the BSI image sensor taken along line A-A' of FIGS. 1-3.

FIGS. 1 through 3 are plan views of a pixel sensor 110 of a BSI image sensor 100 according to aspects of the present disclosure in some embodiments, FIG. 4 is a cross-sectional view of the pixel sensor 110 of the BSI image sensor 100 taken along line A-A' of FIGS. 1-3, and FIG. 5 is a cross-sectional view of a portion of the BSI image sensor 100 according to aspects of the present disclosure in some embodiments. It should be easily understood that same elements in FIGS. 1-5 are designated by the same numerals. As shown in FIGS. 1 through 4, the BSI image sensor 100 includes a substrate 102, and the substrate 102 includes, for example but not limited to, a bulk semiconductor substrate such as a bulk silicon (Si) substrate, or a silicon-on-insulator (SOI) substrate. The substrate 102 has a front side 102F and a back side 102B opposite to the front side 102F. The BSI image sensor 100 includes a plurality of pixel sensors 110 typically arranged within an array, and each of the pixel sensors 110 includes a light-sensing device such as a photodiode 112 disposed in the substrate 102. In other words, the BSI image sensor 100 includes a plurality of photodiodes 112 corresponding to the pixel sensors 110. The photodiodes 112 are arranged in rows and columns in the substrate 102, and configured to accumulate charge (e.g. electrons) from photons incident thereon. Further, logic devices, such as transistor 114, can be disposed over the substrate 102 on the front side 102F and configured to enable readout of the photodiodes 112. The pixel sensors 110 are disposed to receive light with a predetermined wavelength. Accordingly, the photodiodes 112 can be operated to sense visible light of incident light in some embodiments. Or, the photodiodes 112 can be operated to sense infrared (IR) and/or near-infrared (NIR) of the incident light in some embodiments.

An isolation structure 120 such as a deep trench isolation (DTI) structure is disposed in the substrate 102 as shown in FIGS. 1A and 1B. In some embodiments, the DTI structure 120 can be formed by the following operations. For example, a first etch is performed from the back side 102B of the substrate 102. The first etch results in a plurality of deep trenches (not show) surrounding and between the light-sensing regions 112. An insulating material such as silicon oxide (SiO) is then formed to fill the deep trenches using any suitable deposition technique, such as chemical vapor deposition (CVD). In some embodiments, at least sidewalls of the deep trenches are lined by a coating 122 (shown in FIG. 4) and the deep trenches are filled up by an insulating material 124 (shown in FIG. 4). The coating 122 may include a metal such tungsten (W), copper (Cu), or aluminum-copper (AlCu), or an anti-reflection material, which has a refractive index (n) less than silicon, but the disclosure is not limited to this. In some embodiments, the insulating material 124 filling the deep trenches can include the low-n insulating material. A planarization is then performed to remove superfluous insulating material, thus the surface of the substrate 102 on the back side 102B is exposed, and the DTI structure 120 surrounding and between the photodiodes 112 is obtained as shown in FIGS. 1-5. The DTI structure 120 provides optical isolation between neighboring pixel sensors 110 and photodiodes 112, thereby serving as a substrate isolation grid and reducing cross-talk.

A back-end-of-line (BEOL) metallization stack 130 is disposed over the substrate 102 on the front side 102F. The BEOL metallization stack 130 includes a plurality of metallization layers including conductive contacts/vias 132 and conductors 134 stacked in an interlayer dielectric (ILD) layer 136 (all shown in FIGS. 4-5). One or more contacts 132 of the BEOL metallization stack 130 is electrically connected to the logic devices, and one or more conductive vias 132 is electrically connected to the conductors 134 of different layers. In some embodiments, the ILD layer 136 can include a low-k dielectric material (i.e., a dielectric material with a dielectric constant less than 3.9) or an oxide, but the disclosure is not limited to this. The plurality of metallization layers 132/134 may include a metal such as Cu, W, or Al, but the disclosure is not limited to this. In some embodiments, another substrate (not shown) can be disposed between the metallization structure 130 and external connectors such as a ball grid array (BGA) (not shown). And the BSI image sensor 100 is electrically connected to other devices or circuits through the external connectors, but the disclosure is not limited to this.

Referring to FIGS. 1-4, each pixel sensor 110 of the BSI image sensor 100 includes a plurality of conductive structures 142. The conductive structures 142 are disposed in the dielectric layer 136 of the interconnection structure 130. The conductive structures 142 are arranged to align with the isolation structure 120. For example, the conductive structures 142 overlap the isolation structure 120 in a plan view as shown in FIGS. 1-3. In some embodiments, the conductive structures 142 entirely overlap the isolation structure 120 as shown in FIGS. 1-4. In some embodiments, at least a portion of the conductive structures 142 overlap the isolation structure 120. In some embodiments, the conductive structures 142 include conductive contacts, and the conductive contacts and the conductive contacts 132 of the interconnection structure 130 are formed in the same layer. In some embodiments, the conductive structures 142 and those conductive contacts 132 can include the same material, but the disclosure is not limited to this. In some embodiment, those conductive contacts 132 are formed in the lowest portion of the dielectric layer 136 and electrically connected to the pixel sensors 110, therefore those conductive contacts 132 are referred to as the zeroth (V0) vias in the interconnection structure 130. Thus the conductive structures 142 can be referred to as the V0 vias in some embodiments, but the disclosure is not limited to this. In some embodiments, the conductive structures 142 land on the isolation structure 120 and are in contact with the isolation structure 120, as shown in FIG. 4.

Referring to FIGS. 1 and 4, in some embodiments, the conductive structures 142 includes discrete dot-like structures 142a disposed in the interconnection structure 130, as shown in FIG. 1. In some embodiments, each of the dot-like conductive structures 142a includes a diameter D, and the diameter D is less than a width Wd of the isolation structure 120 as shown in FIG. 4. For example but not limited to, the diameter D of the dot-like conductive structures 142a is between about 0.05 micrometer (μm) and about 0.2 μm. Further, the dot-like conductive structures 142a are spaced apart from each other by the dielectric layer 136, and a spacing distance S is defined between the adjacent conductive structures 142a. In some embodiments, a ratio of the spacing distance S over the diameter D of the dot-like conductive structures 142a is between 1.5 and 2.5, but the disclosure is not limited to this. Further, as mentioned above, the pixel sensor 110 is disposed to receive light with a predetermined wavelength, and the spacing distance S is less than a half of the predetermined wavelength. For example but not limited to, when the pixel sensor 110 is operated to sense NIR of the incident light, which includes a wavelength in a range of about 0.75 μm-1.4 μm, the spacing distance S can be in a range of about 0.11 μm-0.7 μm. In some embodiments, the spacing distance S can be about 0.5 μm, but the disclosure is not limited to this.

Referring to FIGS. 2 and 4, in some embodiments, the conductive structures 142 includes discrete bar-like structures 142b disposed in the interconnection structure 130, as shown in FIG. 2. In some embodiments, each of the bar-like conductive structures 142b includes a width W1, and the width W1 is less than the width Wd of the isolation structure 120 as shown in FIG. 4. In some embodiments, the width W1 of the bar-like conductive structures 142b is greater than 0.05 μm. In some embodiments, the width W1 of the bar-like conductive structures 142b is between about 0.05 μm and about 0.2 μm, but the disclosure is not limited to this. Further, the bar-like conductive structures 142b are spaced apart from each other by the dielectric layer 136, and a spacing distance S is defined between the adjacent conductive structures 142b. As mentioned above, the pixel sensor 110 is disposed to receive light with a predetermined wavelength, and the spacing distance S is less than a half of the predetermined wavelength. For example but not limited to, when the pixel sensor 110 is operated to sense NIR of the incident light, the spacing distance S can be in a range of about 0.11 μm-0.7 μm. In some embodiments, the spacing distance S can be about 0.5 μm, but the disclosure is not limited to this. Additionally, the bar-like conductive structures 142b can include a length, and the length is less than a length of the isolation structure 120 in the plan view, as shown in FIG. 2.

Referring to FIGS. 3 and 4, in some embodiments, the conductive structures 142 includes bar-like structures disposed in the interconnection structure 130. Further, the conductive structures 142 are in contact with each other to form a frame-like structure 142c as shown in FIG. 3. In some embodiments, the frame-like conductive structures 142c includes a width W1, and the width W1 is less than the width Wd of the isolation structure 120 as shown in FIG. 4. In some embodiments, a width W1 of the frame-like conductive structures 142c is greater than 0.05 μm. In some embodiments, the width W1 of the frame-like conductive structures 142c is between about 0.05 μm and about 0.2 μm, but the disclosure is not limited to this.

Still referring to FIGS. 1-4, each of the pixel sensors 110 further includes a conductor 144 disposed in the dielectric layer 136 of the interconnection structure 130. In some embodiments, the conductor 144 is arranged to align with the isolation structure 120. As shown in FIGS. 1-3, the conductor 144 can overlap both of the conductive structures 142 and the isolation structure 120 in a plan view. In some embodiments, the conductor 144 entirely overlaps the conductive structures 142 and the isolation structure 120 as shown in FIGS. 1-4. In some embodiments, at least a portion of the conductor 144 overlaps the conductive structures 142 and the isolation structure 120. In some embodiments, the conductor 144 and some of the conductors 134 of the interconnection structure 130 are formed in the same layer. In some embodiments, the conductor 144 and the conductors 134 can include the same material, but the disclosure is not limited to this. In some embodiment, those conductors 134 are the bottom features immediately over the V0 vias and electrically connected to the V0 vias, therefore those conductors 134 are referred to as the first metal (M1) features in the interconnection structure 130. Thus the conductor 144 can be referred to as the M1 features in some embodiments, but the disclosure is not limited to this. The conductor 144 includes a width W2, and the width W2 can be between about 0.03 μm and about 0.1 μm, but the disclosure is not limited to this.

As shown in FIG. 4, the conductive structures 142 are all disposed between the isolation structure 120 and the conductor 144. More importantly, the conductor 144 and the conductive structures 142 form a first reflective structure 140 disposed in the interconnection structure 130. The first reflective structure 140 is arranged to align with the isolation structure 120, as shown in FIGS. 1-4. For example but not limited to, in some embodiments, the first reflective structure 140 can entirely overlap the isolation structure 120 in the plan view. Further, since the diameter D or the width W1 of the conductive structures 142 is less than the width W2 of the conductor 144, the width of the first reflective structure 140 is less than the width Wd of the isolation structure 120. In some embodiments, the first reflective structure 140 is electrically isolated from other elements, but the disclosure is not limited to this.

In some embodiments, each of the pixel sensors 110 includes a plurality of micro structures 116 disposed over the back side 102B of the substrate 102 as shown in FIG. 4. In some embodiments, the micro structures 116 can be formed by following operations. A mask layer (not shown) is disposed over the surface of the substrate 102 on the back side 102B, and followed by forming a patterned photoresist (not shown) over the mask layer. The substrate 102 is then etched through the patterned photoresist and the mask layer from the back side 102B, and thus the plurality of micro structures 116 is formed over the back side 102B of the substrate 102 within each of the pixel sensors 110. Then the patterned photoresist and the mask layer are removed. In some embodiments, further operations such as a wet etch, can be taken. As a result, upper and lower portions of the micro structures 116 are tapered or rounded to obtain a wave pattern as shown in FIG. 4. In some embodiments, the micro structures 116 can be continuous structures and include a wave profile as shown in FIG. 4. In some embodiments, the micro structures 116 can include discrete structure spaced apart from each other by the substrate 102.

In some embodiments, an anti-reflective coating (ARC) 118a and a dielectric layer 118b are disposed over the micro structures 116 on the back side 102B of the substrate 102. As shown in FIG. 4, surfaces of the micro structures 116 are lined by the conformally formed ARC 118a. The dielectric layer 118b fills spaces between the micro structures 116 and provides a substantially even surface over the back side 102B of the substrate 102. In some embodiments, the dielectric layer 118b can include, for example, an oxide such as silicon dioxide, but the disclosure is not limited to this.

In some embodiments, a plurality of color filters 150 (shown in FIG. 4) corresponding to the pixel sensors 110 is disposed over the pixel sensors 110 on the back side 102B of the substrate 102. Further, a low-n structure 160 is disposed between the color filters 150 in some embodiments. In some embodiments, the low-n structure 160 includes a grid structure and the color filters 150 are located within the grid. Thus the low-n structure 160 surrounds each color filter 150, and separates the color filters 150 from each other as shown in FIG. 4. The low-n structure 160 can be a composite structure including layers with a refractive index less than the refractive index of the color filters 150. In some embodiments, the low-n structure 160 can include a composite stack including at least a metal layer 162 and a dielectric layer 164 disposed over the metal layer 162. In some embodiments, the metal layer 162 can include W, Cu, or AlCu. The dielectric layer 164 includes a material with a refractive index less than the refractive index of the color filter 150 or a material with a refractive index less than a refractive index of Si, but the disclosure is not limited to this. Due to the low refractive index, the low-n structure 160 serves as a light guide to direct or reflect light to the color filters 150. Consequently, the low-n structure 160 effectively increases the amount of the light incident into the color filters 150. Further, due to the low refractive index, the low-n structure 160 provides optical isolation between neighboring color filters 150.

Each of the color filters 150 is disposed over each of the corresponding photodiodes 112. The color filters 150 are assigned to corresponding colors or wavelengths of lights, and configured to filter out all but the assigned colors or wavelengths of lights. In some embodiments, the color filters 150 assignments alternate between red, green, and blue lights, such that the color filters 150 include red color filters, green color filters and blue color filters. The red color filters, the green color filters and the blue color filters are arranged in a Bayer or other mosaic pattern in those embodiments that the photodiode 112 is operated to sense visible light of incident light. In some embodiments, the color filters 150 are assigned to infrared radiation when the photodiode 112 is operated to sense IR and/or NIR of the incident light.

In some embodiments, a plurality of micro-lens 152 corresponding to the pixel sensors 110 is disposed over the color filters 150. It should be easily understood that locations and areas of each micro-lens 152 correspond to those of the color filter 150 as shown in FIG. 4.

Figure 5:
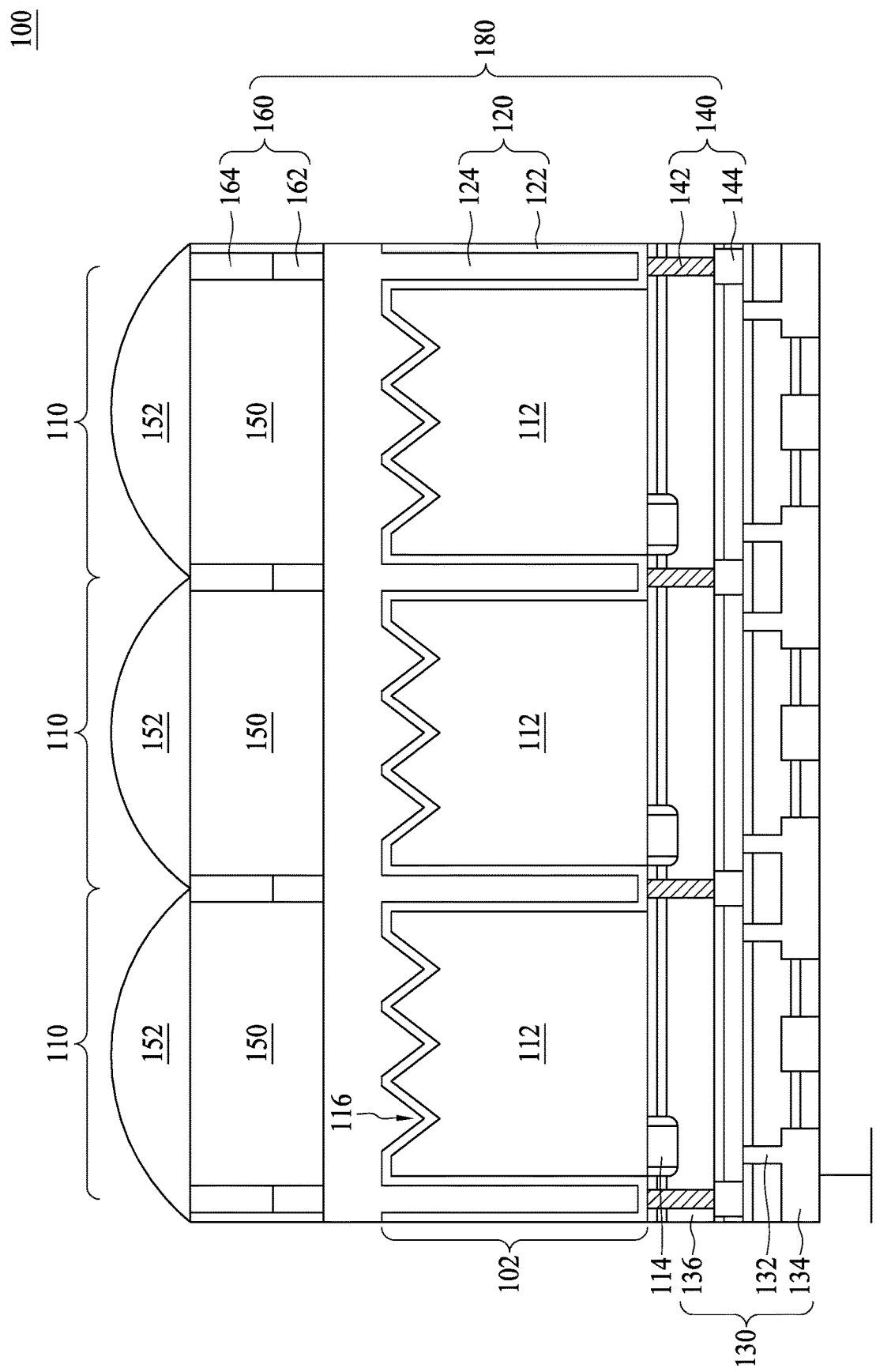
FIG. 5 is a cross-sectional view of a portion of a BSI image sensor according to aspects of the present disclosure in some embodiments.

Referring to FIGS. 4 and 5, in some embodiments, the BSI image sensor 100 includes the plurality of pixel sensor 110 as mentioned above. More importantly, the first reflective structure 140 (including the conductive structure(s) 142 and the conductive feature 144), the isolation structure 120, and the low-n structure 160 form a reflective grid 180, and the reflective grid penetrates the substrate 102 from the front side 102F to the back side 102B as shown in FIGS. 4 and 5. The pixel sensors 110 are disposed within the reflective grid 180 and separated from each other by the reflective grid 180. Accordingly, the incident light is condensed to by the micro-lens 152 over each color filter 150 and then converged to the color filter 150. Further, the incident light passing the color filter 150 is directed or reflected back to the pixel sensor 110 by the low-n structure 160 of the reflective grid 180, the incident light passing the substrate 102 is directed or reflected back to the photodiode 112 by the isolation structure 120 of the reflective grid 180, and the incident light passing the interconnection structure 130 is directed or reflected back to the pixel sensor 110 by the first reflective structure 140 of the reflective grid 180. In other words, light leaking to neighboring pixel sensors 110 is blocked and consequently cross talk between neighboring pixel sensors 110 is mitigated.

Figure 6:
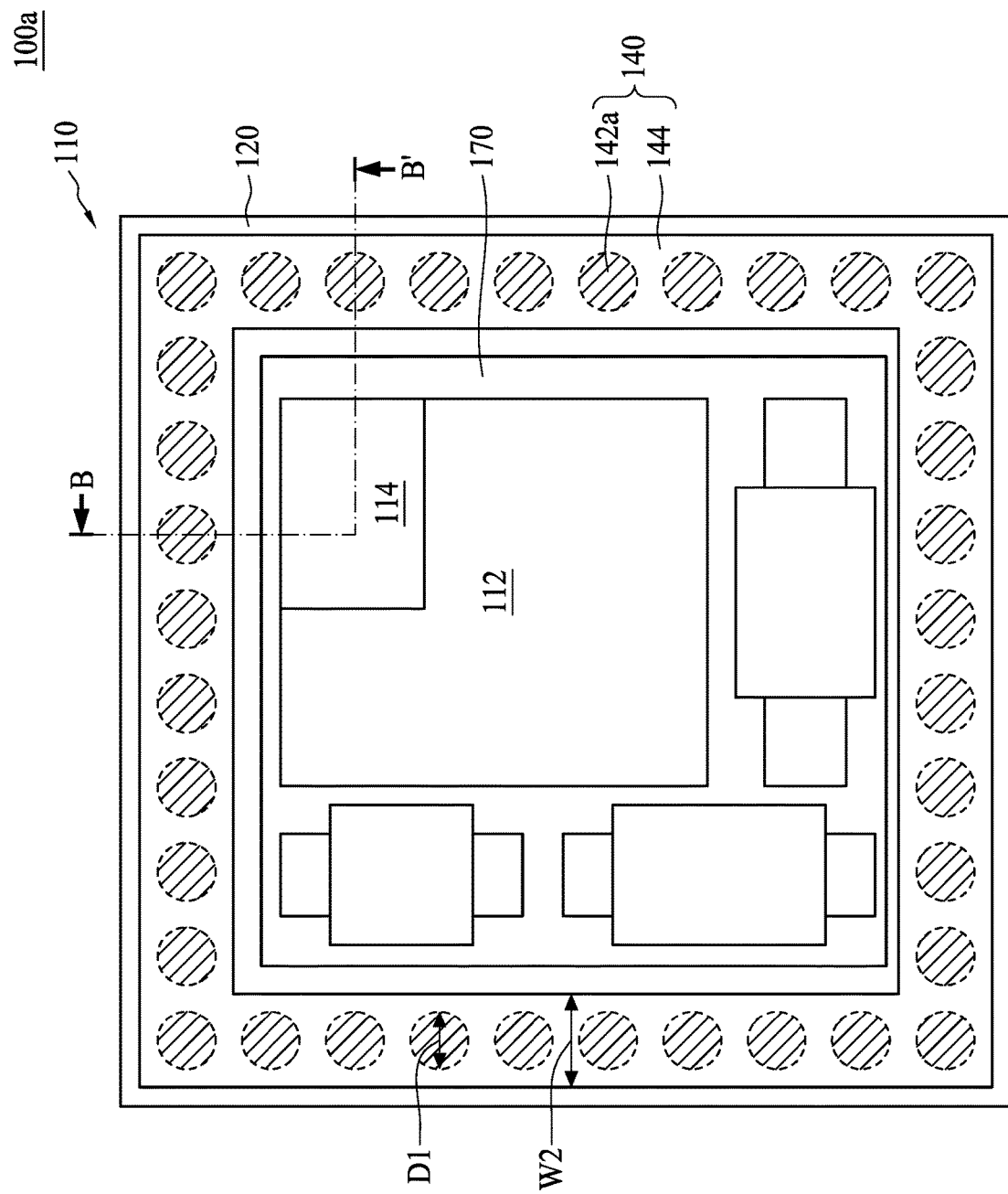
FIG. 6 is a plan view of a pixel sensor of a BSI image sensor according to aspects of the present disclosure in one or more embodiments.
Figure 7:
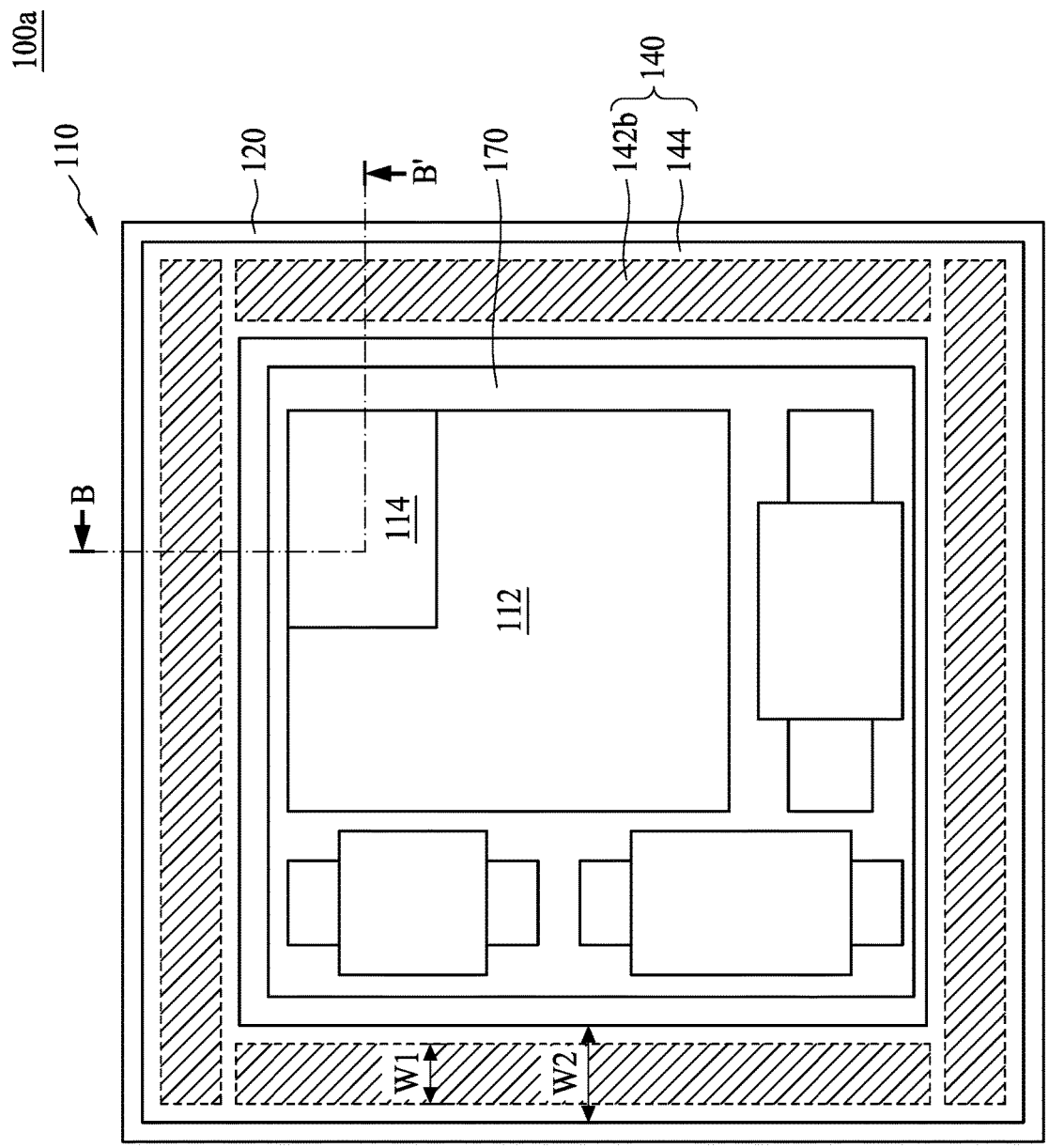
FIG. 7 is a plan view of a pixel sensor of a BSI image sensor according to aspects of the present disclosure in one or more embodiments.
Figure 8:
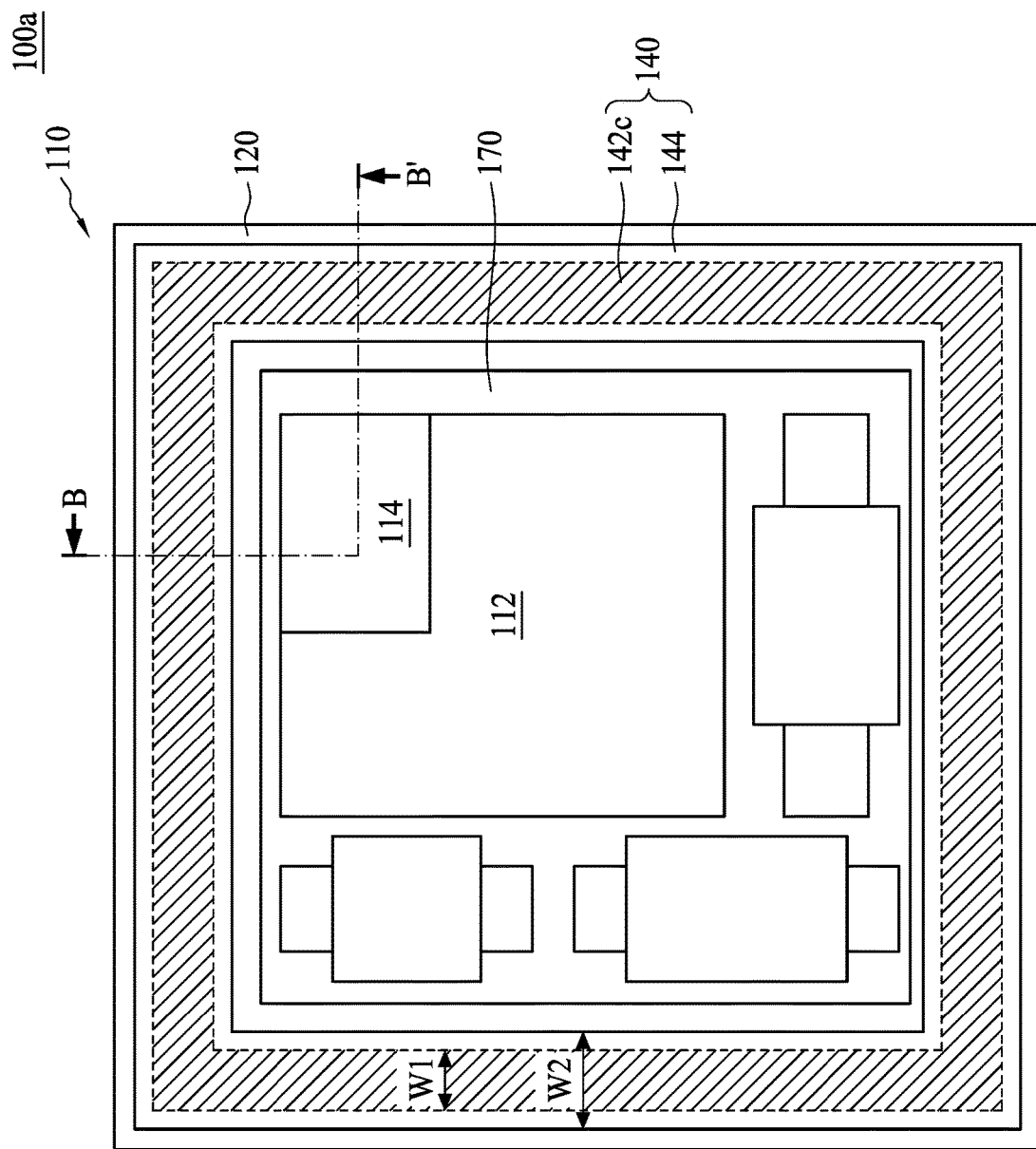
FIG. 8 is a plan view of a pixel sensor of a BSI image sensor according to aspects of the present disclosure in one or more embodiments.
Figure 9:
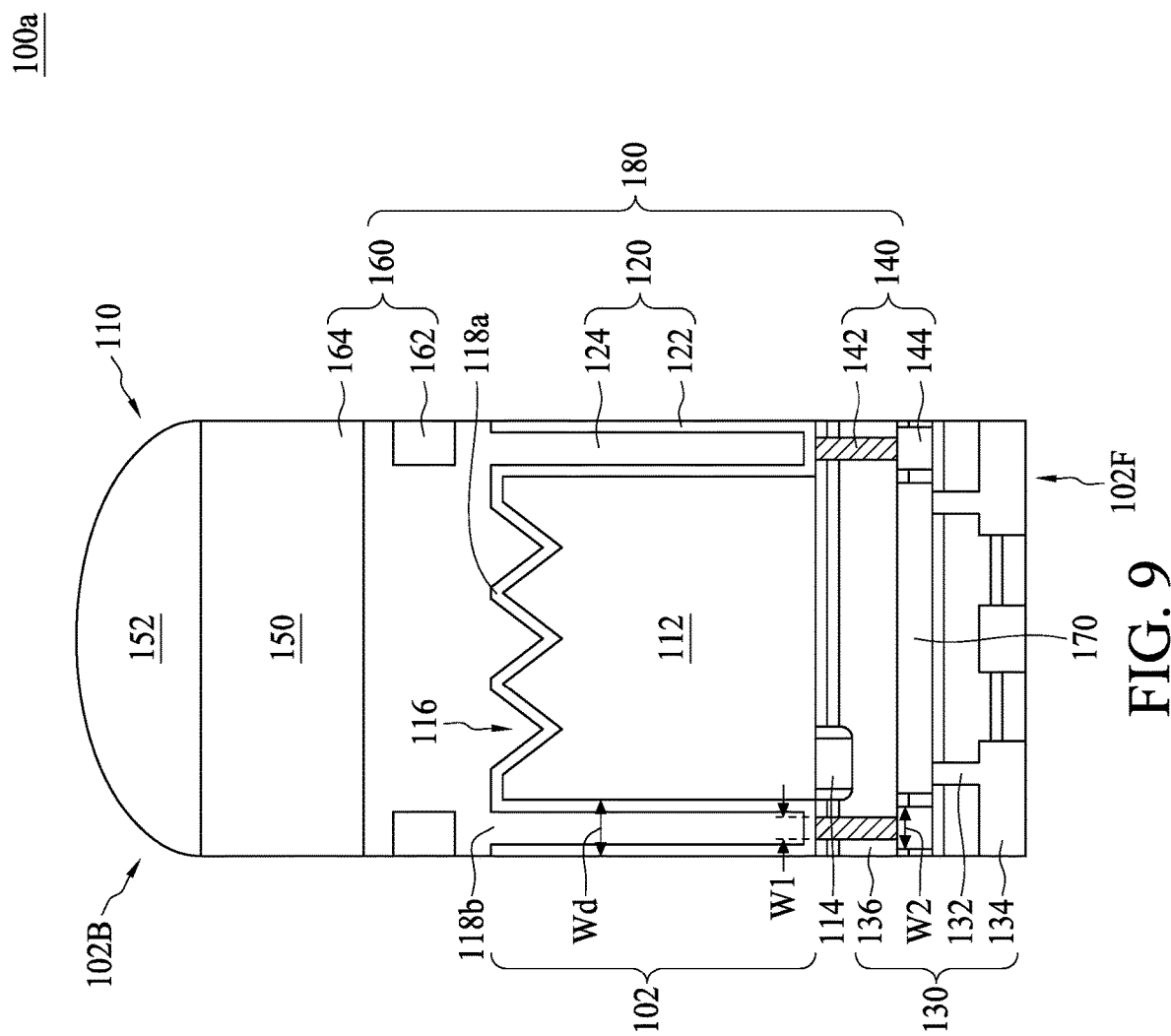
FIG. 9 is a cross-sectional view of the pixel sensor of the BSI image sensor taken along line B-B' of FIGS. 6-8.

FIGS. 6 through 8 are plan views of a pixel sensor 110 of a BSI image sensor 100a according to aspects of the present disclosure in some embodiments, FIG. 9 is a cross-sectional view of the pixel sensor 110 of the BSI image sensor 100a taken along line B-B' of FIGS. 6-8, and FIG. 10 a cross-sectional view of a portion of the BSI image sensor 100a according to aspects of the present disclosure in some embodiments. It should be easily understood that same elements in FIGS. 1-10 are designated by the same numerals, details of those same elements are omitted in the interest of brevity. As shown in FIGS. 6 through 9, the BSI image sensor 100a includes a substrate 102, and the substrate 102 has a front side 102F and a back side 102B opposite to the front side 102F. The BSI image sensor 100a includes a plurality of pixel sensors 110 typically arranged within an array. Each of the pixel sensors 110 includes a light-sensing device such as a photodiode 112 configured to accumulate charge (e.g. electrons) from photons incident thereon. Further, logic devices, such as transistor 114, can be disposed over the substrate 102 on the front side 102F configured to enable readout of the photodiodes 112. The pixel sensor 110 is disposed to receive light with a predetermined wavelength. Therefore the photodiode 112 is operated to sense visible light of incident light in some embodiments. Or, the photodiode 112 is operated to sense IR and/or NIR of the incident light in some embodiments.

An isolation structure 120 such as a DTI structure is disposed in the substrate 102 as shown in FIGS. 6-9. In some embodiments, the isolation structure 120 can include a coating 122 (shown in FIG. 9) and an insulating material 124 (shown in FIG. 9). The isolation structure 120 provides optical isolation between neighboring pixel sensors 110 and photodiodes 112, thereby serving as a substrate isolation grid and reducing cross-talk. A BEOL metallization stack 130 is disposed over the substrate 102 on the front side 102F. The BEOL metallization stack 130 includes a plurality of metallization layers including conductive contacts/vias 132 and conductive features 134 stacked in an ILD layer 136 (all shown in FIGS. 9-10). One or more contacts 132 of the BEOL metallization stack 130 is electrically connected to the logic devices, and one or more conductive vias 132 is electrically connected to conductive features 134 of different layers.

Referring to FIGS. 6-9, each pixel sensor 110 of the BSI image sensor 100a includes a plurality of conductive structures 142 disposed in the dielectric layer 136 of the interconnection structure 130. The conductive structures 142 are arranged to align with the isolation structure 120. As mentioned above, the conductive structures 142 can entirely overlap the isolation structure 120 in a plan view as shown in FIGS. 6-8, but the disclosure is not limited to this. The conductive structures 142 include conductive contacts, and can be referred to as the V0 vias in some embodiments. In some embodiments, the conductive structures 142 contact the isolation structure 120, as shown in FIG. 9. Referring to FIGS. 6 and 9, in some embodiments, the conductive structures 142 includes discrete dot-like structures 142a disposed in the interconnection structure 130 and arranged along the isolation structure 120 in a plan view, as shown in FIG. 6. It should be understand that parameters of the dot-like structures 142a can be the same with those described above, therefore those details are omitted for simplicity. Referring to FIGS. 7 and 9, in some embodiments, the conductive structures 142 includes discrete bar-like structures 142b disposed in the interconnection structure 130, as shown in FIG. 7. It should be understand that parameters of the bar-like structures 142b can be the same with those described above, therefore those details are omitted for simplicity. Referring to FIGS. 8 and 9, in some embodiments, the conductive structures 142 include bar-like structures, and the bar-like structures are in contact with each other to form a frame-like structure 142c as shown in FIG. 8. It should be understand that parameters of the frame-like structures 142c can be the same with those described above, therefore those details are omitted for simplicity.

Still referring to FIGS. 6-9, each of the pixel sensors 110 further includes a conductor 144 disposed in the dielectric layer 136 of the interconnection structure 130. The conductor 144 is arranged to align with the isolation structure 120. As mentioned above, the conductor 144 can entirely overlap both of the conductive structures 142 and the isolation structure 120 in a plan view as shown in FIGS. 6-8, but the disclosure is not limited to this. The conductor 144 can be referred to as the M1 feature in some embodiments, but the disclosure is not limited to this. Further, as shown in FIG. 9, the conductive structures 142 are all disposed between the isolation structure 120 and the conductor 144. More importantly, the conductor 144 and the conductive structures 142 form a first reflective structure 140 disposed in the interconnection structure 130. And the first reflective structure 140 is arranged to align with the isolation structure 120, as shown in FIGS. 6-9. For example, the first reflective structure 140 can entirely overlap the isolation structure 120, but the disclosure is not limited to this. Since the diameter D or the width W1 of the conductive structures 142 is less than a width W2 of the conductive feature 144, the width of the first reflective structure 140 is less than the width Wd of the isolation structure 120. In some embodiments, the first reflective structure 140 is electrically isolated from other elements, but the disclosure is not limited to this.

In some embodiments, each of the pixel sensors 110 further includes a second reflective structure 170 disposed in the interconnection structure 130 over the front side 102F, and overlapping at least a portion of the pixel sensor 110. As shown in FIGS. 6-9, the second reflective structure 170 at least overlaps the photodiode 112 of the pixel sensor 110. In some embodiments, the second reflective structure 170 can be the M1 feature. In other words, the second reflective structure 170 and the conductive feature 144 of the first reflective structure 140 are formed in the same layer and may include the same material. However, the first reflective structures 140 are electrically isolated from the second reflective structure 170, as shown in FIGS. 6-9. In some embodiments, the second reflective structure 170 is electrically isolated from not only the first reflective structure 140, but also other elements. However in some embodiments, the second reflective structure 170 is electrically grounded through the interconnection structure 130, as shown in FIG. 10.

As mentioned above, each of the pixel sensors 110 includes a plurality of micro structures 116 disposed over the substrate 102 on the back side 102B as shown in FIG. 9. In some embodiments, an ARC 118a and a dielectric layer 118b are disposed over the micro structures 116 on the back side 102B of the substrate 102. In some embodiments, a plurality of color filters 150 (shown in FIG. 9) corresponding to the pixel sensors 110 is disposed over the pixel sensors 110 on the back side 102B of the substrate 102. Further, a low-n structure 160 is disposed between the color filters 150 in some embodiments. As mentioned above, the low-n structure 160 includes a grid structure and the color filters 150 are located within the grid. Thus the low-n structure 160 surrounds each color filter 150, and separates the color filters 150 from each other as shown in FIG. 9. The low-n structure 160 can be a composite structure including layers with a refractive index less than the refractive index of the color filters 150. In some embodiments, the low-n structure 160 can include a composite stack including at least a metal layer 162 and a dielectric layer 164 disposed over the metal layer 162.

In some embodiments, a plurality of micro-lens 152 corresponding to the pixel sensors 110 is disposed over the color filters 150. It should be easily understood that locations and areas of each micro-lens 152 correspond to those of the color filter 150 as shown in FIG. 9.

Figure 10:
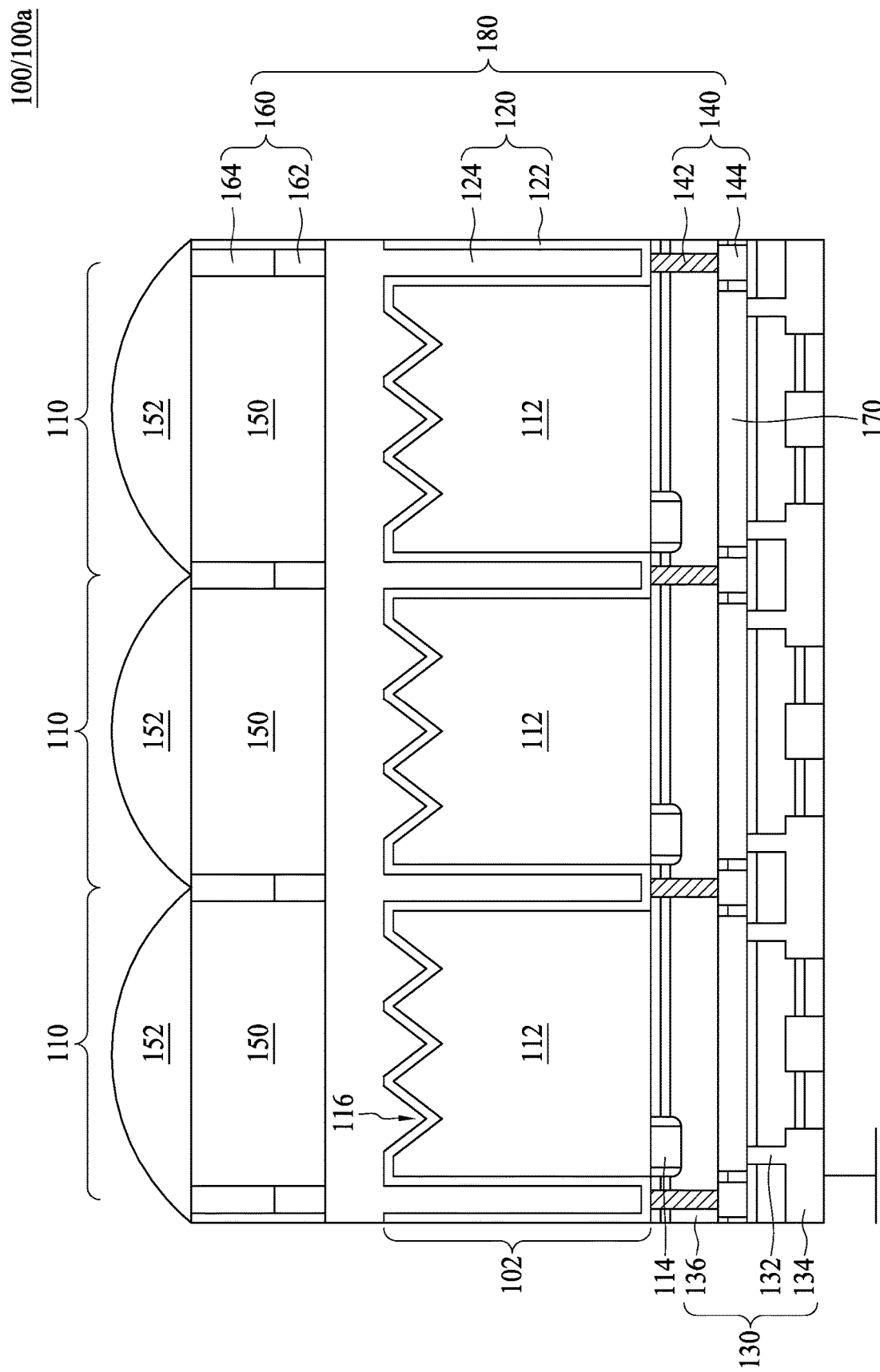
FIG. 10 is a cross-sectional view of a portion of a BSI image sensor according to aspects of the present disclosure in some embodiments.

Referring to FIGS. 9 and 10, in some embodiments, the BSI image sensor 100a includes the plurality of pixel sensor 110 as mentioned above. More importantly, the first reflective structure 140 (including the conductive structure(s) 142 and the conductive feature 144), the isolation structure 120, and the low-n structure 160 form a reflective grid 180, and the reflective grid penetrates the substrate 102 from the front side 102F to the back side 102B as shown in FIGS. 9 and 10. The pixel sensors 110 are disposed within the reflective grid 180 and separated from each other by the reflective grid 180. Accordingly, the incident light is condensed to by the micro-lens 152 over each color filter 150 and then converged to the color filter 150. Further, the incident light passing the color filter 150 is directed or reflected back to the pixel sensor 110 by the low-n structure 160 of the reflective grid 180, the incident light passing the substrate 102 is directed or reflected back to the photodiode 112 by the isolation structure 120 of the reflective grid 180, and the incident light passing the interconnection structure 130 is directed or reflected back to the pixel sensor 110 by the first reflective structure 140 of the reflective grid 180. In other words, light leaking to neighboring pixel sensors 110 is blocked and consequently cross talk between neighboring pixel sensors 110 is mitigated. Further, the incident light reaching the interconnection structure 130 is further reflected back to the photo-sensing region 112 by the second reflective structure 170, and thus more light can be absorbed by the photodiode 112. Accordingly, light is trapped in the pixel sensors 110, and thus quantum efficiency (QE) is improved.

In the present disclosure, a BSI image sensor including a reflective grid is provided. The reflective grid can include the low-n structure separating the color filters and the isolation structure separating the photo-sensing regions. More importantly, the reflective grid includes the first reflective structure and the second reflective structure formed in the interconnection structure. The first reflective structure reduces light entering to neighboring pixel sensor and the second reflective structure reflects light back to the photodiode. Accordingly, cross talk is reduced and sensitivity of the pixel sensor is improved. Additionally, since the first reflective structures and the second reflective structures can be formed in the interconnection structure, the provided BSI image sensor is compatible with existing CIS fabrication without developing extra operations.

In some embodiments, a BSI image sensor is provided. The BSI image sensor includes a substrate including a front side and a back side opposite to the front side, a pixel sensor disposed in the substrate, an isolation structure surrounding the pixel sensor and disposed in the substrate, a dielectric layer disposed over the pixel sensor on the front side of the substrate, and a plurality of conductive structures disposed in the dielectric layer and arranged to aligned align with the isolation structure.

In some embodiments, a BSI image sensor is provided. The BSI image sensor includes a substrate including a front side and a back side opposite to the front side, a pixel sensor disposed in the substrate, an isolation structure surrounding the pixel sensor and disposed in the substrate, an interconnection structure disposed over the substrate on the front side, and a first reflective structure disposed in the interconnection structure and aligned to the isolation structure.

In some embodiments, a BSI image sensor is provided. The BSI image sensor includes a substrate including a front side and a back side opposite to the front side, a plurality of pixel sensors disposed in the substrate, and a reflective grid penetrating the substrate from the front side to the back side. The pixel sensors are disposed within the reflective grid and separated from each other by the reflective grid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back side illumination (BSI) image sensor comprising:
   a substrate comprising a front side and a back side opposite to the front side;
   a pixel sensor in the substrate;
   a logic device disposed over the front side of the substrate;
   an isolation structure surrounding the pixel sensor in the substrate;
   a dielectric layer over the pixel sensor on the front side of the substrate; and
   a plurality of conductive structures disposed in the dielectric layer and arranged to align with the isolation structure,
   wherein at least one of the conductive structures is entirely overlapped by the isolation structure in a direction normal to the substrate, and the at least one of the conductive structures is separated from the logic device,
   wherein the isolation structure further comprises an insulating material portion and a conductive coating, and sidewalls of the insulating material portion are lined with the conductive coating.

2. The BSI image sensor of claim 1, wherein the pixel sensor is disposed to receive light with a wavelength.

3. The BSI image sensor of claim 2, wherein the conductive structures are spaced apart from each other by the dielectric layer, and a spacing distance between the conductive structures is less than a half of the wavelength.

4. The BSI image sensor of claim 3, wherein the spacing distance is less than 0.5 micrometers ($\mu m$).

5. The BSI image sensor of claim 3, wherein each of the conductive structures comprises a diameter, and the diameter is between about 0.05 $\mu m$ and about 0.2 $\mu m$.

6. The BSI image sensor of claim 3, wherein each of the conductive structures comprises a bar-like structure spaced apart from each other by the dielectric layer.

7. The BSI image sensor of claim 1, wherein the conductive structures are contact with each other to form a frame-like structure in the dielectric layer.

8. A back side illumination (BSI) image sensor comprising:
   a substrate comprising a front side and a back side opposite to the front side;
   a pixel sensor in the substrate;
   a logic device disposed over the front side of the substrate;
   an isolation structure surrounding the pixel sensor in the substrate;
   an interconnection structure over the substrate on the front side; and
   a first reflective structure disposed in the interconnection structure and aligned to the isolation structure,
   wherein the first reflective structure is entirely overlapped by the isolation structure in a direction normal to the substrate, and the first reflective structure is separated from the logic device,
   wherein the isolation structure further comprises an insulating material portion and a conductive coating, and sidewalls of the insulating material portion are lined with the conductive coating.

9. The BSI image sensor of claim 8, wherein a width of the first reflective structure is less than a width of the isolation structure.

10. The BSI image sensor of claim 8, wherein the first reflective structure comprises a plurality of first conductive contacts and a first conductor, and the first conductive contacts are disposed between the first conductor and isolation structure.

11. The BSI image sensor of claim 10, wherein a width of the first conductive contacts is less than a width of the first conductor.

12. The BSI image sensor of claim 10, wherein the first conductive contacts contact the isolation structure.

13. The BSI image sensor of claim 8, further comprising a second reflective structure disposed in the interconnection structure and overlapping at least a portion of the pixel sensor.

14. The BSI image sensor of claim 13, wherein the first reflective structures are electrically isolated from the second reflective structure.

15. The BSI image sensor of claim 13, wherein the second reflective structure is electrically grounded.

16. The BSI image sensor of claim 8, wherein the interconnection structure further comprises a plurality of second conductive contacts and a plurality of second conductive features.

17. A back side illumination (BSI) image sensor comprising:
   a substrate comprising a front side and a back side opposite to the front side;
   a photodiode in the substrate, and
   a reflective grid penetrating the substrate from the front side to the back side;
   wherein the reflective grid further comprises a first reflective portion, a second reflective portion and a third reflective portion, the first reflective portion is disposed in the substrate and surrounds the photodiode, the second reflective portion is disposed on the front side of the substrate, the third reflective portion is disposed on the back side of the substrate, and the first reflective portion, the second reflective portion and the third reflective portion are aligned in a direction normal to the substrate.

18. The BSI image sensor of claim 17, wherein the reflective gird comprises:
   a substrate isolation structure surrounding and between the pixel sensors in the substrate;
   a first reflective structure disposed over the substrate on the front side and aligned with the isolation structure; and
   a low-n structure disposed over the substrate on the back side and aligned with the isolation structure.

19. The BSI image sensor of claim 18, further comprising a plurality of color filters disposed within the low-n structure over the substrate on the back side.

20. The BSI image sensor of claim 17, further comprising a plurality of second reflective structures disposed over the pixel sensors on the front side, and the each of the second reflective structures overlapping at least a portion of each pixel sensor.

* * * * *